United States Patent [19]

Burke

[11] 4,095,412
[45] Jun. 20, 1978

[54] FLEXIBLE CABLE FOR DIGITAL WATCH

[75] Inventor: Roger A. Burke, Laguna Beach, Calif.

[73] Assignee: Hughes Aircraft Company, Culver City, Calif.

[21] Appl. No.: 587,487

[22] Filed: Jun. 16, 1975

[51] Int. Cl.² ............... G04C 3/00; G04B 29/00; G04B 37/00; H05K 1/00
[52] U.S. Cl. ............... 58/50 R; 58/23 BA; 58/52 R; 58/55; 58/59; 339/17 F; 361/398
[58] Field of Search ........... 58/23 R, 23 BA, 50 R, 58/55; 339/17 F; 361/398

[56] References Cited

U.S. PATENT DOCUMENTS

| 3,778,999 | 12/1973 | Vuffray | 58/55 |
| 3,838,568 | 10/1974 | Zurcher | 58/88 C |
| 3,866,406 | 2/1975 | Roberts | 58/4 A |
| 3,968,640 | 7/1976 | Clemmer | 58/23 BA |

*Primary Examiner*—E. S. Jackmon
*Attorney, Agent, or Firm*—Fay I. Konzem; W. H. MacAllister

[57] ABSTRACT

A flexible printed circuit, located within a digital watch, which provides the interconnection circuitry between the digital watch's electro-optical displays and the electronic components and the batteries and the watch push buttons. The flexible printed circuit consists of a pliable plastic material to which battery contacts, push button contacts, interconnection circuitry (between the batteries, watch push buttons, electronic component, and electro-optical displays), and contacts for the electronic components and displays are affixed.

7 Claims, 2 Drawing Figures

FLEXIBLE CABLE FOR DIGITAL WATCH

BACKGROUND OF THE INVENTION

1. Field of the Invention

This invention relates to flexible circuitry within a digital watch, and more particularly to a flexible cable containing contacts for the batteries, push buttons, oscillator crystal, electronic components, electro-optical display elements, and interconnections between said contacts.

2. Description of the Prior Art

In the art, flexible cables have been employed in digital watches. The structure of such a cable is disclosed in U.S. Pat. No. 3,968,640, filed Sept. 16, 1974, entitled, "Digital Watch with Elastomer Housing Block and Flexible Printed Circuitry" and assigned to the same assignee of the present invention, which is Hughes Aircraft Company. The prior art digital watch contained contacts on the cable for the batteries and the push buttons, and the ceramic substrate was placed on this cable, the substrate being the base for the electronic circuitry and components. On the other hand, the flexible cable of the present invention acts as a base for all of the electrical contacts and interconnections, thereby eliminating the ceramic substrate of the prior art.

SUMMARY OF THE INVENTION

The flexible cable, in accordance with the invention, consists of a flexible material, such as a synthetic polymer composition material to which contacts for the batteries, push buttons, electronic components, and display devices and the interconnection circuitry are affixed. The battery contacts are used for connecting the batteries to the electronic circuitry and the electro-optical displays. The push button contacts connect the digital watch push buttons to the electronic circuitry and display elements. The other contacts affixed to the flexible material interconnect the display elements and the electronic components.

Accordingly, it is an object of this invention to provide a flexible cable on which battery contacts, push button contacts, electronic components, and electro-optical display elements are fixed.

The features of the present invention which are believed to be novel are set forth with particularity in the appended claims. The present invention, both as to its organization and manner of operation, together with further objects and advantages thereof, may be better understood by reference to the following description, taken in connection with the accompanying drawings.

DETAILED DESCRIPTION

Figure 1:
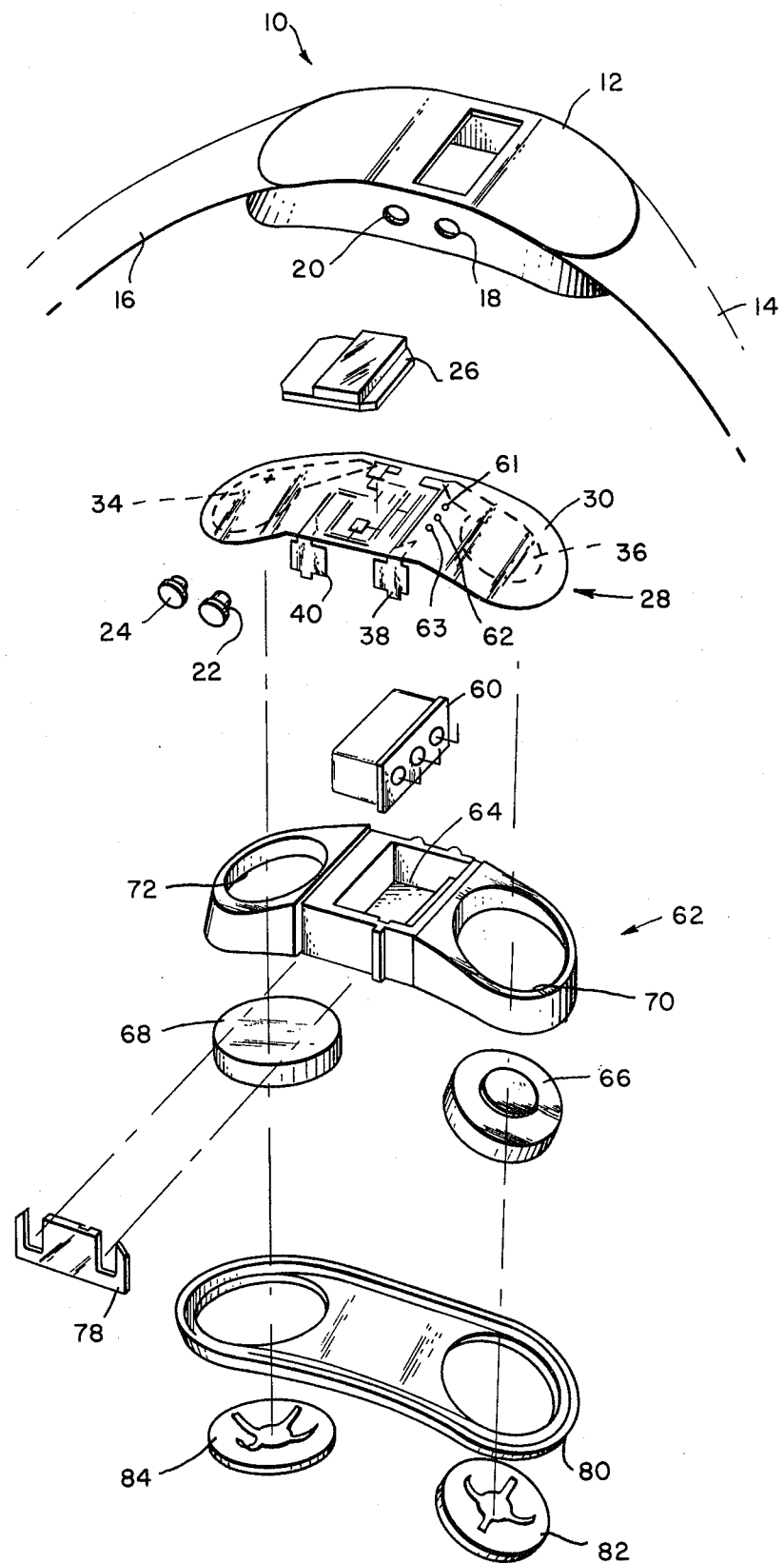
FIG. 1 is an exploded view of the component parts of a digital watch constructed with the flexible cable of the present invention.

Referring now to FIG. 1, the digital watch 10 has a case 12 which is provided with watch securing straps 14 and 16. Into digital watch case 12 is first placed display element cover 26, followed by flexible cable 28. Push buttons 22 and 24 are inserted in holes 18 and 20 of case 12 and make contact with beryllium-copper contacts 38 and 40. Flexible cable 28 consists of a synthetic polymer composition base material 30, such as Kapton with copper or copper alloy contacts affixed thereto.

Oscillator crystal 60 is positioned in recess 64 of elastomer housing block 62. The leads of oscillator crystal 60 are inserted through holes 61, 62, and 63 of flexible cable 28, thereby making electrical contact with the printed circuitry 32 on said flexible cable. Battery 66 is inserted through hole 70 of elastomer housing block 62. Battery 68 is inserted in hole 72 of elastomer housing block 62. The watch case bottom 80 is placed on the bottom side of case 12, and battery hatch covers 82 and 84 are engaged upon the bottom of batteries to thrust said batteries upward. An optional spring in back may replace battery hatches.

Figure 2:
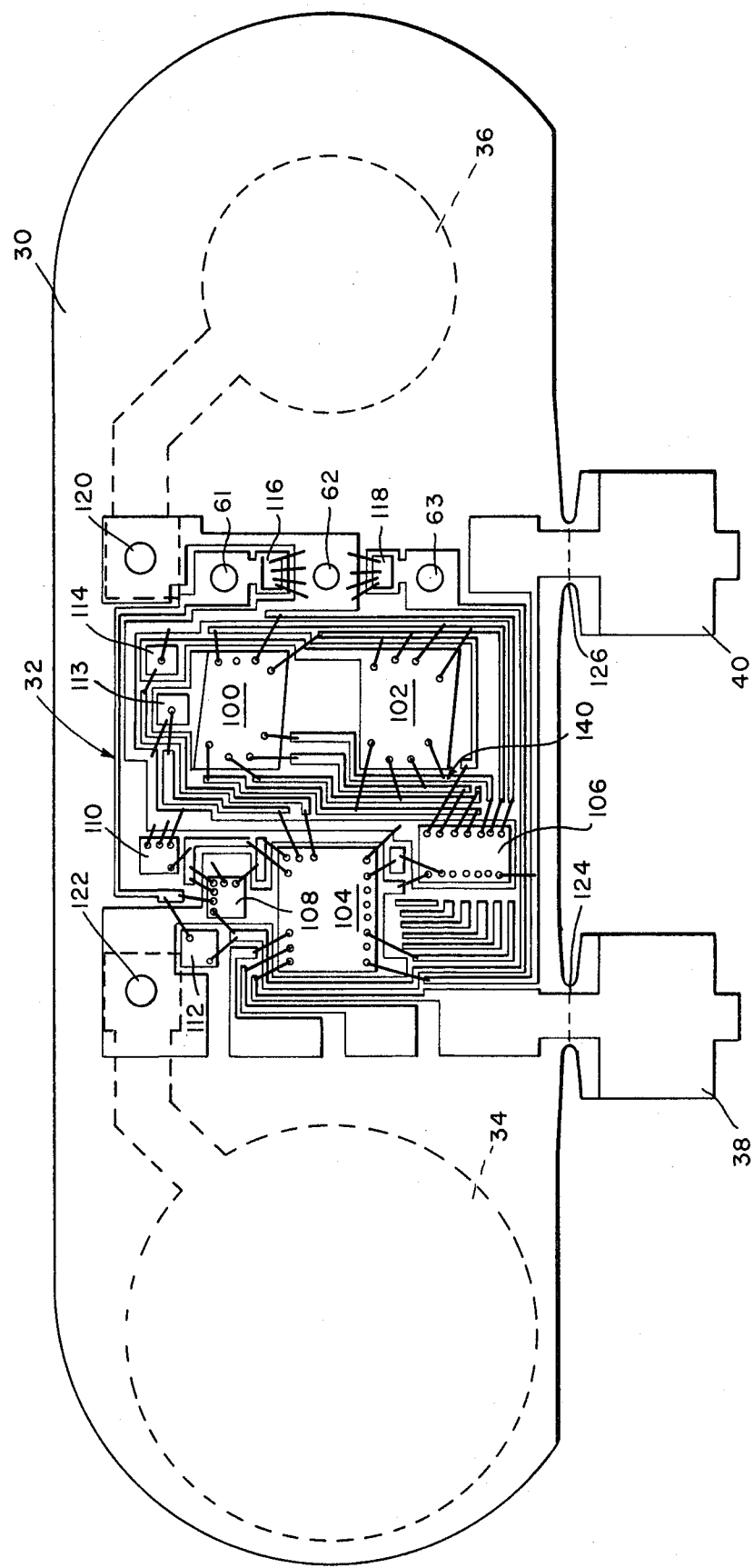
FIG. 2 is a detailed top view of the flexible cable of the present invention.

Referring now to FIG. 2, flexible cable 28 consists of a synthetic base material such as Kapton. In making flexible cable 28, an adhesive is first spread over the base material 30. Next, copper or copper alloy is bonded onto plastic material 28. Then, a layer of photo-sensitive material or photo-resist pattern is generated over the copper material. The photographic mask or pattern forms the desired circuitry. A light is then shone on the surface of the flexible cable thereby exposing the photo-sensitive material in the area where the copper material removal is desired. Finally, the cable is placed in an etching tank in order to etch away the area on the cable which was not exposed. Hence, leaving the desired circuitry and contacts affixed to the base flexible material 30. An alternate method is to sensitize the adhesive surface with the desired circuit pattern, and chemically plate the conductor circuitry only.

The copper or copper alloy material at contact 34 is placed in contact with the positive side of the first battery 66 and the copper or copper alloy material at contact 36 is placed in contact with the negative side of the second battery 68. The contacts electrically connect the batteries to the watch electronic components and electro-optical display elements.

Copper or copper alloy contacts 38 and 40 are folded at a 90° angle at points 124 and 126 to connect the watch electronic components and display elements to push buttons 22 and 24 of FIG. 1. When push button 22 is depressed, its shaft travels until it touches contact 38 of the flexible cable 28, thus grounding contact 38 through the push button shaft to the watch case 12 and thereby activating the display devices in order to display a specific set of horological information.

Likewise, when recessed push button 24 is depressed by using a sharp implement, the push button shaft travels until it touches contact 40, thus grounding contact 40 through the push button shaft to case 12 and thereby resetting the horological information.

Various integrated circuit chips are placed at positions 104, 106, and 108. Resistors or resistive materials are placed at positions 110 and 112. Likewise, capacitors are positioned at points 116 and 118. Interconnection of components is achieved by ultrasonically or thermo-compression bonding an aluminum or gold wire (140) from a pad on the component to a location on the copper or copper alloy circuitry as shown in FIG. 2.

Interconnection circuitry 32 interconnects the various electronic components to each other and to batteries 66 and 68 through battery pads 34 and 36 and also through contacts 38 and 40 to push buttons 22 and 24. Finally, the electro-optical display elements such as light emitting diodes (LED's) are placed at positions 100 and 102 and also ultrasonically bonded to circuitry.

The leads from oscillator crystal 60 are inserted through holes 61, 62, and 63 to make electrical contact with the various electronic components on the flexible cable 28. Holes 120 and 122 in said flexible cable are used to position said cable on elastomer housing block 62.

Although the device which has just been described appears to afford the greatest advantages for implementing the invention, it will be understood that various modifications can be made thereto without going beyond the scope of the invention, it being possible to replace certain elements by other elements capable of fulfilling the same technical function therein.

One such alternate would be a single sided flexible cable. Battery pads 34 and 36 would be manufactured on the same side as circuitry 32 and then bent over to the same position as shown in FIG. 2.

What is claimed is:

1. A digital watch comprising an oscillator for producing a time signal, electronic components for controlling a plurality of electro-optical display devices which display the time, a plurality of pushbuttons for activating said display devices, a plurality of batteries for energizing said electronic components and said display devices, wherein the improvement comprises a flexible cable consisting of:

a flexible base;

at least one battery contact affixed to said flexible base;

at least one pushbutton contact;

interconnection circuitry for electrically connecting the batteries through said battery contacts to the electronic components and display devices and for electrically connecting the push buttons through said pushbutton contacts to the electronic components and display devices.

2. A digital watch as recited in claim 1, wherein said battery contacts consist of a thin layer of patterned electrically conductive material which is applied to said flexible base, said base consists of a thin layer of flexible plastic composition material.

3. A digital watch as recited in claim 1, wherein said battery contacts on said flexible base consist of a thin layer of a copper containing material which is applied to a thin layer of a flexible plastic composition material, said battery contacts electrically connect said batteries to said electronic components into said display devices.

4. A digital watch as recited in claim 1, wherein said pushbutton contacts consist of a thin layer of a copper containing material, said pushbutton contacts electrically connect said push buttons to said electronic components and to said display devices.

5. A digital watch comprising an oscillator for producing a time signal, electronic components for controlling a plurality of electro-optical display devices which display the time, a plurality of push buttons for activating said display devices, a plurality of batteries for energizing said electronic components in said display devices, wherein the improvement comprises a flexible cable consisting of:

a flexible base;

at least one battery contact affixed to said flexible base;

at least one pushbutton contact affixed to said flexible base;

interconnection circuitry affixed to said flexible base for electrically connecting the batteries through said battery contacts to the electronic components and display devices and for electrically connecting the push buttons through said pushbutton contacts to the electronic components and display devices.

6. A digital watch as recited in claim 5, wherein said battery and pushbutton contacts and said interconnection circuitry consist of a thin layer of patterned electrically conductive material which is applied to said flexible base, said base consists of a thin layer of a flexible plastic material.

7. A digital watch as recited in claim 1, wherein the flexible cable is positioned on an elongated spacer block having a center portion and first and second end portions, said block having two holes, one hole located in said first end portion and said second hole located in said second end portion;

a battery situated in each of said holes for energizing said electronic components and display devices;

said spacer block consist of a molded elastomeric material.

* * * * *